United States Patent [19]

Haartsen

[11] Patent Number: 5,561,399
[45] Date of Patent: Oct. 1, 1996

[54] CASCADED MULTI-RESONATOR OSCILLATOR HAVING HIGH Q-VALUE

[75] Inventor: Jacobus Haartsen, Staffanstorp, Sweden

[73] Assignee: Telefonaktiebolaget LM Ericsson, Stockholm, Sweden

[21] Appl. No.: 424,077

[22] Filed: Apr. 19, 1995

[51] Int. Cl.[6] ............................................. H03B 5/12
[52] U.S. Cl. ..................... 331/57; 331/50; 331/117 R; 331/172; 331/175
[58] Field of Search ........................ 331/34, 36 C, 331/50, 52, 57, 60, 116 R, 116 FE, 117 R, 117 FE, 117 D, 108 B, 135–137, 175, 177 R, 177 V, 53, 172

[56] References Cited

U.S. PATENT DOCUMENTS

| | | | |
|---|---|---|---|
| 1,745,559 | 2/1930 | Schrack et al. | 331/57 |
| 1,754,882 | 4/1930 | Clement | 331/57 |
| 2,294,797 | 9/1942 | Nelson | 331/57 |
| 2,393,331 | 1/1946 | McWhirter et al. | 331/57 |
| 3,321,188 | 12/1964 | Bozeman . | |
| 3,609,579 | 9/1971 | Chappell et al. . | |
| 3,763,446 | 10/1973 | Toyoshima et al. . | |
| 4,184,131 | 1/1980 | Haus . | |
| 4,965,539 | 10/1990 | Korber, Jr. . | |
| 5,194,836 | 3/1993 | Vale et al. . | |
| 5,418,497 | 5/1995 | Martin | 331/117 RX |

FOREIGN PATENT DOCUMENTS

| | | |
|---|---|---|
| 2831628 | 1/1980 | Germany . |
| 4321565.3 | 1/1995 | Germany . |
| 1029595 | 5/1966 | United Kingdom . |
| 2220316 | 1/1990 | United Kingdom . |

OTHER PUBLICATIONS

N. Nguyen et al., "A 1.8–GHz Monolithic LC Voltage–Controlled Oscillator," *IEEE Journal of Solid–State Circuits*, vol. 27, No. 3, Mar. 1992, pp. 444–450.

Primary Examiner—David Mis
Attorney, Agent, or Firm—Burns, Doane, Swecker & Mathis, L.L.P.

[57] ABSTRACT

An apparatus and method are provided for increasing the Q-value of an oscillator so that a net gain in the stability of the oscillators is obtained. In the apparatus and method, a plurality of units, which each include a passive frequency-selective circuit and an active amplifier, are cascaded and the required isolation between the passive frequency-selective circuits is maintained by the active amplifier acting as a buffer. As a result, interaction and loading is prevented between the passive frequency-selective circuits so that the net gain in the stability of the oscillator is achieved because the Q-value of the oscillator is increased.

16 Claims, 4 Drawing Sheets

5,561,399

CASCADED MULTI-RESONATOR OSCILLATOR HAVING HIGH Q-VALUE

BACKGROUND

The present invention is directed to improving the stability of oscillators in applications such as communication systems which up or down convert signals in the transmitters and/or receivers and in frequency synthesizers where pure and stable frequency references are required. Other applications for the device and method of the present invention are in systems that require highly stable clock signals for reference purposes such as watches and computing devices and the device and method are also useful in any area where oscillators are applied. More particularly, the present invention is directed to concatenating a plurality of resonator/amplifiers in a loop to increase the effective quality and thereby the stability of the oscillator.

Any system in which timing is important in some way has a local oscillator and many systems also require accurate frequency references that are generated locally. For instance, radio would not be possible without a local oscillator in the transmitter and receiver for converting the information signals to the proper frequency bands. The performance of these systems is highly dependent on the stability of the frequency provided by the oscillator. Phase jitter (phase noise) in the output of the oscillator limits the accuracy of the reference and therefore limits the accuracy of the entire system. Amplitude variations in the output of the oscillator are important as well in many applications but these amplitude variations can be readily suppressed with a limiter or an automatic gain control.

The general structure for high performance oscillators include an amplifier which has its output fed back to its input via a resonating structure. The resonating structure produces a large output change when the frequency in the feedback loop varies and this output change opposes the frequency variations so that the frequency variations are minimized. As the change in the resonator output on a frequency variation becomes larger, the correction also becomes stronger. The resonator change with frequency is indicated by a quality or Q-value. A higher Q-value indicates that the resonator is more sensitive to frequency variations and therefore the ultimate oscillator output frequency will be more stable. In order to provide oscillators having pure and stable frequency outputs, low noise and high Q-values are required for the oscillator. High Q-values in the resonating structures for stable oscillators are essential because the final output spectrum of the oscillator is determined by the noise generated in the loop and the Q-value of the resonator.

FIG. 1 illustrates the configuration for a typical oscillator where an amplifier 10 is fed back by a passive, phase rotating network 20. The oscillator 5 starts to oscillate at the frequency for which the Barkhausen conditions are fulfilled where the loop gain is exactly 1 and the loop phase is 0 or a multiple of $2\pi$. The oscillator 5 is preferably designed such that the phase condition occurs in the steepest part in the phase characteristics of the resonator. More precisely, the Q-value of the network 20 is related to the phase derivative, or group delay $\delta\phi/\delta f$ of the resonator according to:

$$Q = \left| \frac{1}{2} f_0 \frac{\delta\phi}{\delta f} \right| \qquad \text{EQUATION 1}$$

where $f_0$ is the resonating frequency in Hz.

The output spectrum of the oscillator 5 can be determined by modeling the oscillator 5 as an extremely narrow band filter that filters the noise in the feedback loop. The noise power spectral density at the output $S_v$, is thereby proportional to the white noise density $S_n$ in the loop and inversely proportional to $Q^2$ of the resonating structure according to:

$$S_v = \frac{S_n}{v^2 Q^2} \quad [V^2/Hz] \qquad \text{EQUATION 2}$$

where $v = f/f_0 - f_0/f$.

One technique for increasing the stability of an oscillator is to increase the effective Q-value by concatenating a plurality of passive, phase rotating networks. However, in practical use, the resonators used in the passive, phase rotating network 20 are either two-port or three-port devices which are generally not unilateral. Cascading these networks results in electrical interactions, and therefore does not result in an increase in the effective Q-value of the cascaded circuit. Resonators cannot simply be concatenated electrically in practical use due to the characteristics of the network. Therefore, it is desired to provide a means to cascade frequency selective circuits of an oscillator which prevents interaction and loading between the resonators.

SUMMARY

An object of the present invention is to provide an apparatus and method for increasing the Q-value of the oscillator by cascading a plurality of units, which each include a passive frequency selective circuit and an active amplifier to obtain an oscillator exhibiting a net increase for stability.

Another object of the present invention is to realize a net gain in the stability of an oscillator having a passive resonator and an active amplifier, which form an oscillating loop, by increasing the Q-value of the oscillator and thereby realizing a net gain in stability.

These objects of the present invention are fulfilled by providing an oscillator comprising a plurality of passive frequency selective circuits and a plurality of active amplifiers fed back through said passive frequency selective circuits by cascading a plurality of units which each include a pair of one of said passive frequency selective circuits and one of said active amplifiers to form an oscillating loop. By cascading the entire passive frequency selective circuit/active amplifier units, a net gain in the stability of the oscillator is obtained because the noise produced in the units is uncorrelated but the total Q-value is increased. In cascading these units, the active amplifier acts as a buffer to prevent interaction between the cascaded resonators and a net increase in the stability of the oscillator is obtained.

The objects of the present invention are also fulfilled by providing a method for increasing the stability of an oscillator comprising the steps of cascading a plurality of units, which each include a pair of a passive frequency selective circuit and an active amplifier, and feeding back said active amplifiers through said passive frequency selective circuits in an oscillating loop formed by said plurality of cascaded units. This method also increases the effective Q-value of the oscillator by cascading the plurality of units so that the active amplifiers act as a buffer to prevent interaction between the cascaded resonators.

Further scope of applicability of the present invention will become apparent from the detailed description given hereinafter. However, it should be understood that the detailed description and specific examples, all indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention wherein.

DETAILED DESCRIPTION

Figure 2A:
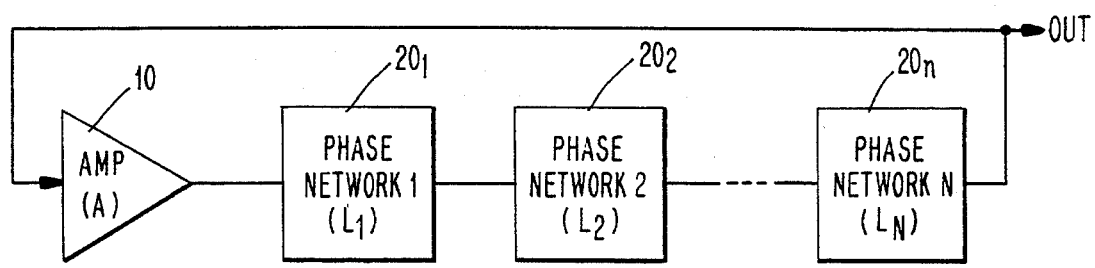
FIG. 2(a) illustrates a signal model of a multi-resonator oscillator according to prior art.

FIG. 2(a) illustrates an example of a multi-resonator oscillator according to the prior art. In FIG. 2(a), an amplifier 10 is connected to a plurality of passive phase rotating networks $20_1, 20_2, \ldots 20_n$ which are concatenated. If two phase rotating networks 20 are concatenated (wherein n=2), the total Q-value (or the phase derivative or the group delay) is increased by a factor of 2 provided the phase rotating networks $20_2, 20_2, \ldots 20_n$ do not interact or load each other. Although the total noise power density $S_n$ in the loop, which is assumed to be produced by the (uncorrelated) real parts of the phase rotating networks 20, is also increased by a factor of 2, a net reduction by a factor of 2 in the spectral power density $S_v$ at the output is realized as shown by Equation 2. The relationship provided by Equation 2 can be generalized to the N resonators cascaded as illustrated in FIG. 2(a). The same theory applies as in Equation 2 such that both the noise power density $S_n$ and the loop quality Q increase by a factor N and the spectral power density at the output is:

$$S_v = \frac{1}{N} \frac{S_n}{v^2 Q^2} \ [V^2/Hz] \qquad \text{EQUATION 3}$$

As shown by the relationship in Equation 3, as more resonators are cascaded (as N increases), the carrier to noise ratio at the oscillator output is improved.

Figure 1:
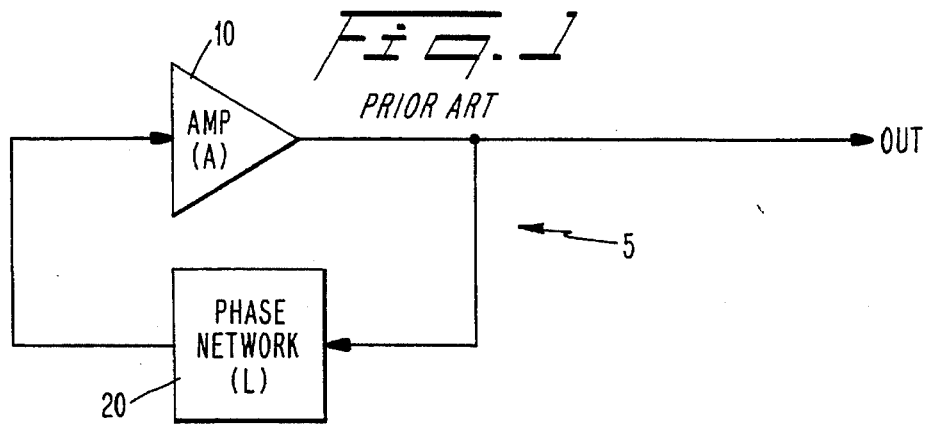
FIG. 1 illustrates a simplified model of a general oscillator.
Figure 2B:
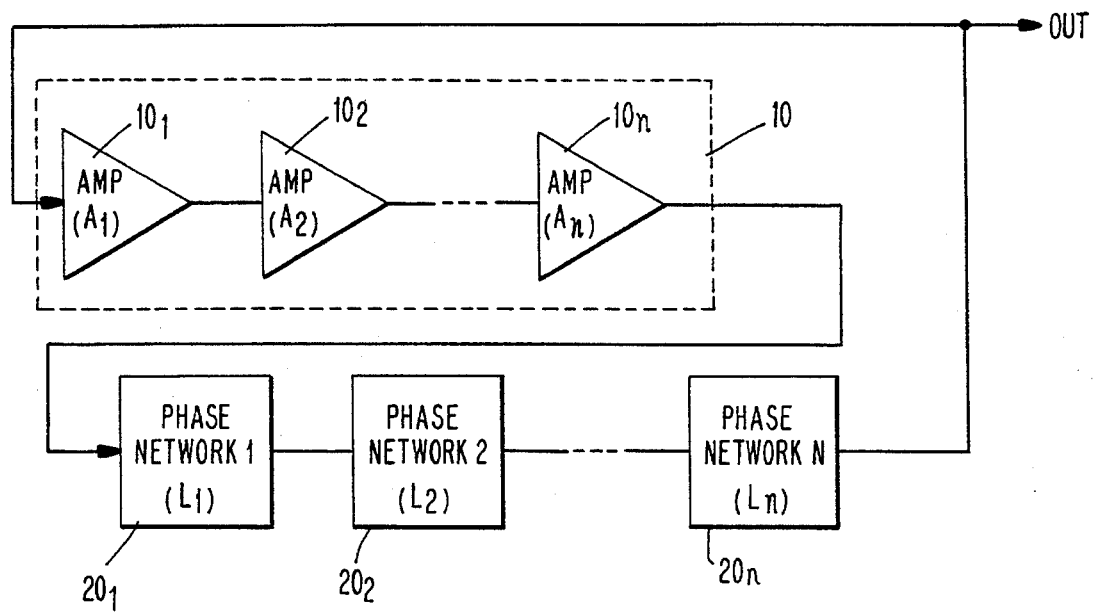
FIG. 2(b) illustrates a signal model of a multi-resonator oscillator with cascaded amplification stages.
Figure 2C:
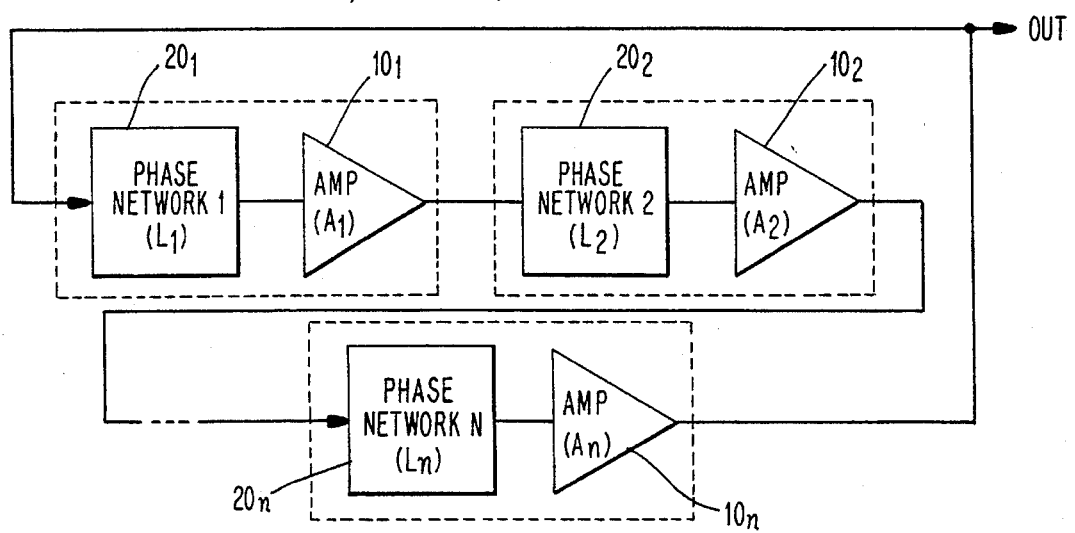
FIGS. 2(c) illustrates a signal model of a multi-resonator oscillator using distributed amplifiers according to an embodiment of the present invention.

In FIG. 2(a), the phase rotating networks 20 are assumed to be unilateral four port networks. However, in practice, the phase rotating networks 20 are either two port devices with one port grounded, or three port devices that are not unilateral. For two port devices, concatenating the devices results in a parallel connection which will neither increase the Q-value nor improve the noise performance. For three port devices, the phase rotating networks cannot be considered as independent and therefore the phase rotating networks 20 load each other which does not provide the increase of the Q-value according to Equation 3. In FIG. 1, the loss L (in dB) in the passive resonator is compensated by the gain A (in dB) in the amplifier. In FIG. 2(a), each passive resonator has a loss L, resulting in a total loss of N×L (in dB) for the N cascaded passive resonators. The total loss must be compensated by the amplifier which therefore has to increase its amplification to N×A (in dB). In FIG. 2(b), the increased amplification has been achieved by cascading N amplifiers each with amplification A. In the embodiment of the present invention, the amplification is distributed over the loop in such a way that each resonator is followed by an amplification stage with amplification A as illustrated in FIG. 2(c). Each resonator/amplifier unit can be considered as a unit. A plurality of these units can be cascaded without any problem, because the amplifier is a unilateral device which buffers the resonator and prevents loading and electrical interactions between the resonators.

When considering the oscillator as a loop with amplification stages and phase rotating networks, the oscillator resonates at a frequency for which the total phase rotation in the loop is a multiple of 360°. Each of the phase rotating networks 20 preferably has a rapid phase change around the resonance frequency so that the noise in the loop is less effective in varying the output frequency (phase jitter). The steepness of the phase change around the resonance frequency is proportional to the quality or the Q-value of the phase rotating networks 20. The overall Q-value of the oscillator can be increased by cascading multiple phase rotating networks. Even though the noise in the feedback loop increases due to the noise of the added phase rotating networks, a net increase in the oscillator stability is realized. The output spectral density of the oscillator is proportional to the total noise power in the feedback loop and inversely proportional to $Q^2$. The noise power increases linearly with the number of phase rotating networks because the noise sources in the phase rotating networks can be assumed uncorrelated. The effective Q-value also increases proportionally to the number of phase rotating networks and the resulting spectral power density at the output of the oscillator decreases inversely proportional to the number of phase rotating networks applied.

Figure 3A:
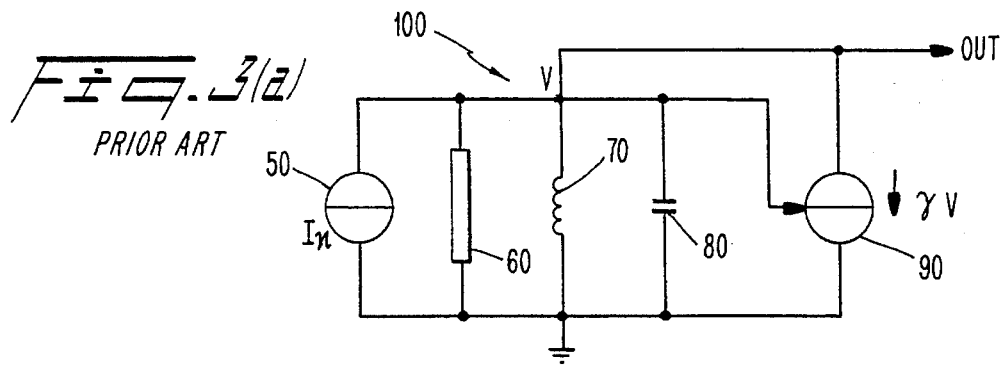
FIG. 3(a) illustrates a model of a single parallel resonance oscillator.
Figure 3B:
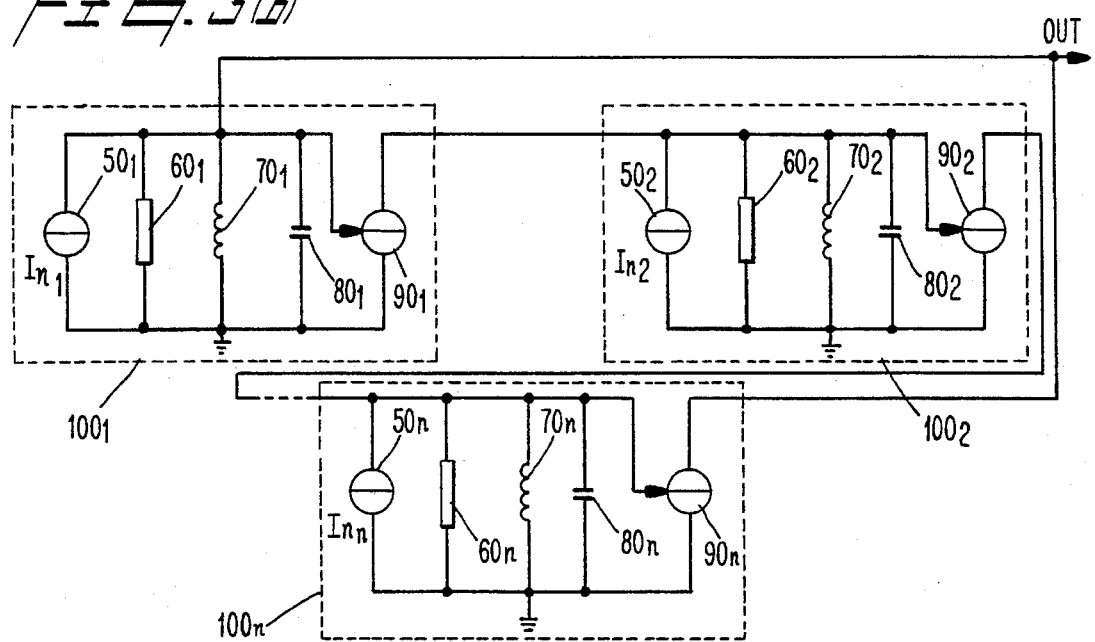
FIG. 3(b) illustrates a model of a multiple parallel resonance oscillator according to an embodiment of the present invention.

FIG. 3(a) illustrates an example of a known configuration for a single parallel resonance oscillator. FIG. 3(a) illustrates a single parallel resonance oscillator 100 which includes a current source 50, a resistor 60, an inductor 70, a capacitor 80, and a transconductance amplifier 90. The current source 50 represents the noise generated in the resonator and in the transconductance amplifier 90 as an equivalent noise source $I_n$ in parallel to the resonator. A factor $\gamma$ is a proportionality constant giving the relationship between the current of the voltage-controlled current source and a control voltage V. Therefore, $\gamma$ is the transconductance of the transconductance amplifier 90 represented by the voltage-controlled current source. To obtain the multi-resonator oscillator as described in this invention, the feedback loop for the parallel resonance oscillator 100 is opened at the transconductance output so that the network 100 may be cascaded in order to form a multiple parallel resonance oscillator as illustrated in FIG. 3(b). FIG. 3(b) illustrates a plurality of the parallel resonance oscillator networks $100_1, 100_2, \ldots 100_n$ cascaded by connecting the output from one phase rotating network to the input of the next phase rotating network and connecting the output of the last transconductance amplifier $90_n$ to feed back to the first network $100_1$. By assuming that the equivalent noise current sources are uncorrelated, the multiple resonance oscillator having N stages will exhibit a 10logN dB lower spectral power density then the single resonance oscillator as illustrated in FIG. 3(a).

Figure 4:
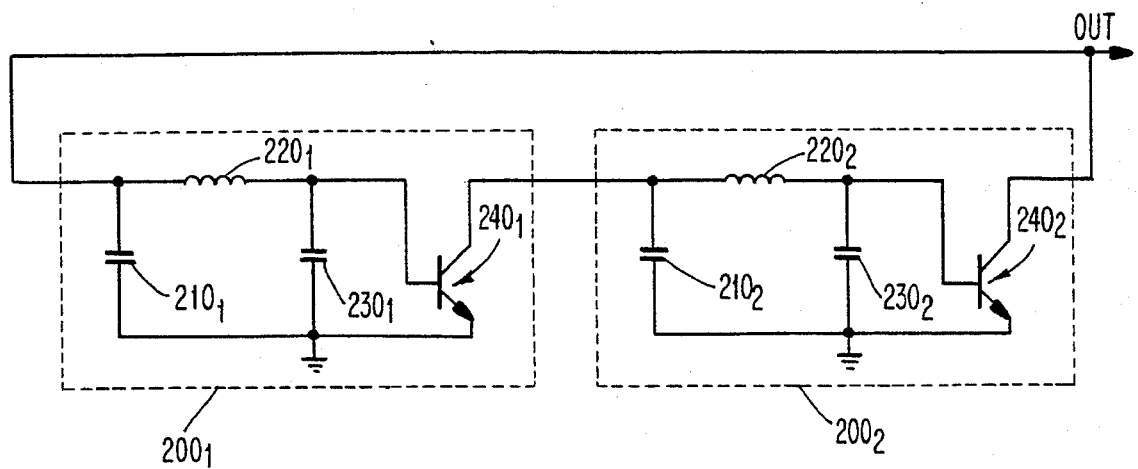
FIG. 4 illustrates a Colpitt-type of a dual resonator oscillator.

There are many types of resonator/amplifier configurations possible and FIG. 4 illustrates yet another embodiment of a dual resonator oscillator having a Colpitt-like structure. FIG. 4 illustrates two resonator/amplifier configurations $200_1$ and $200_2$ which each include first capacitors $210_1$ and $210_2$, inductors $220_1$ and $220_2$, second capacitors $230_1$ and $230_2$, and transistors $240_1$ and $240_2$. The transistors $240_1$ and $240_2$ represent transconductances. The output of the first stage is connected to the input of the second stage and the output of the second stage is fed back to the input of the first stage. When forming the feedback loop, the total phase rotation must be maintained at a multiple of 360°. Therefore, this dual resonator oscillator can be expanded to a multiple resonator oscillator by maintaining the feedback loop at a multiple of 360°. For example, if the resonator/amplifier units produce a phase rotation of 180°, an even number of the resonator/amplifier units must be used to close the feedback loop, and if the phase rotation of the resonator/amplifier units is 360°, either an odd or even number of resonator/amplifier units may be used.

Figure 5A:
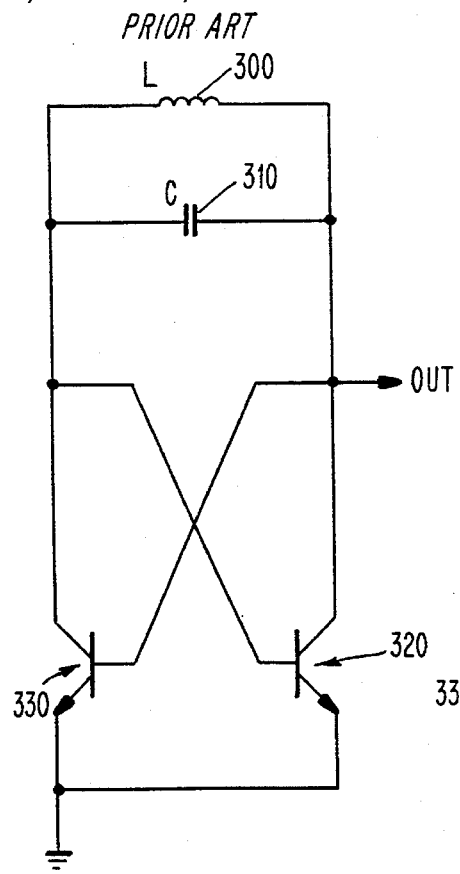
FIG. 5(a) illustrates a balanced oscillator having a parallel LC resonator.
Figure 5B:
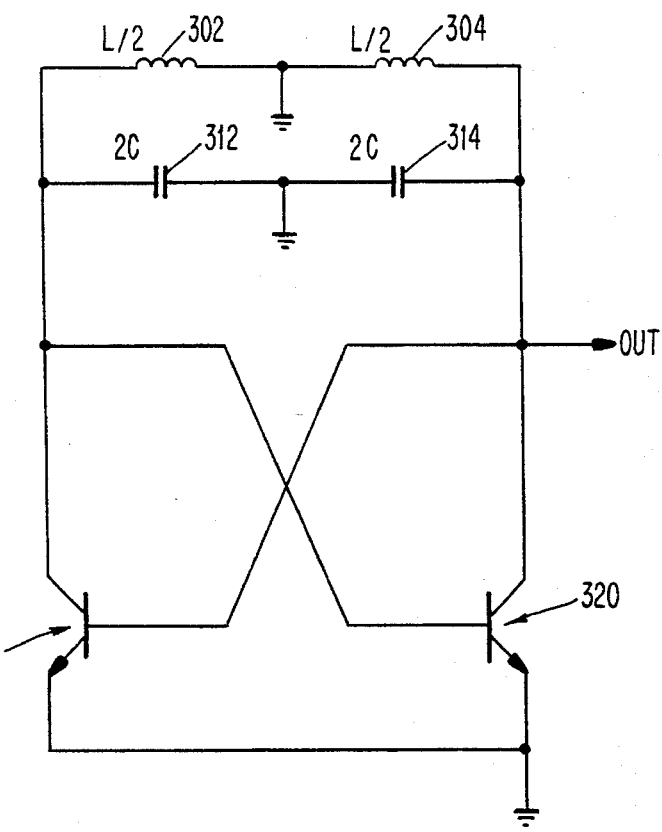
FIG. 5(b) illustrates an equivalent circuit of the balanced oscillator of FIG. 5(a)
Figure 5C:
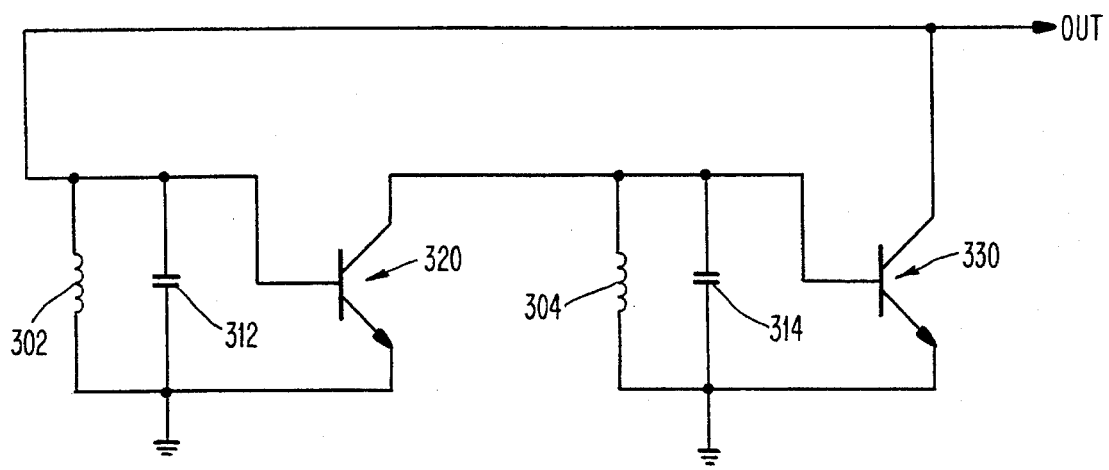
FIG. 5(c) illustrates an equivalent circuit of the balanced oscillator of FIG. 5(b) visualizing the dual resonator characteristics.

FIG. 5(a) illustrates a known balanced oscillator using a parallel LC resonance. This known parallel LC resonator includes two transistors 320 and 330 connected in a balanced configuration to a capacitor 310 and an inductor 300. However, this known parallel LC resonator can also be considered as a dual resonator oscillator as illustrated in FIG. 5(c) for another embodiment of the present invention. In FIG. 5(b), the capacitor 300 and the inductor 310 illustrated in FIG. 5(a) are split into two parts in series to form inductors 302 and 304 and capacitors 312 and 314 which are grounded at the intersection points. This shows that the balanced oscillator is actually a dual resonator oscillator, because FIG. 5(b) is equivalent to FIG. 5(c) which clearly visualizes the dual resonator nature according to an embodiment of the present invention.

Figure 6:
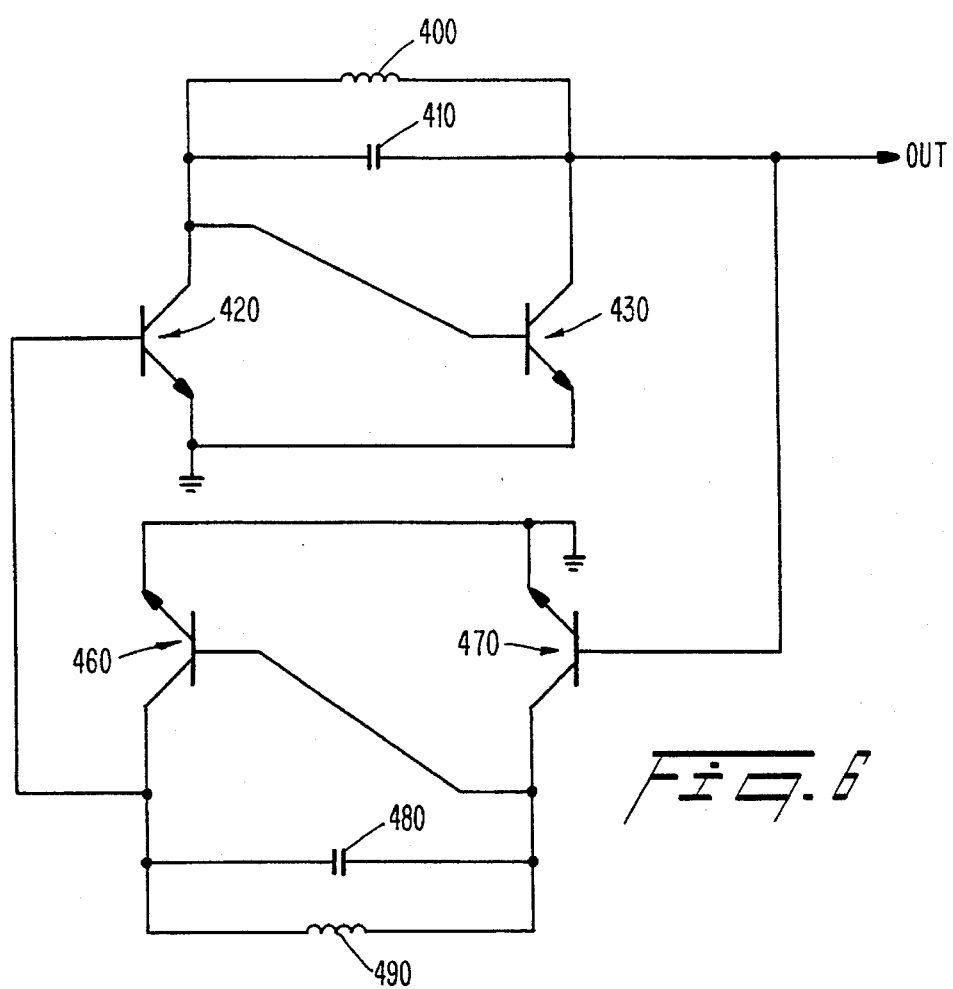
FIG. 6 illustrates a quadruple resonator having parallel LC resonators.

The construction of the dual resonator oscillator as shown in FIGS. 5(a), 5(b), and 5(c) can be extended with yet another balanced configuration which results in a quadruple resonator oscillator as shown in FIG. 6. With the same techniques as visualized in FIGS. 5(a), 5(b), and 5(c), the quadruple resonator oscillator of FIG. 6 can be visualized as a cascade of four parallel resonator/amplifier units. The quadruple resonator oscillator includes two parallel resonances formed by an inductor 400 and capacitor 410 and by an inductor 490 and capacitor 480. Four transistors 420, 430, 460, and 470 are disposed in a common-emitter configuration and are connected in series to form a loop. This quadruple resonator oscillator configuration has a 6 dB noise improvement over the single resonator oscillator illustrated in FIG. 3(a).

This technique of cascading phase rotating networks and resonator/amplifier units can also be applied to voltage and current controlled oscillators (VCOs). For these VCOs, one or more resonators will have a controllable component such as a varactor in parallel to the resonance capacitor (not shown).

With multiple resonators in a circuit, mutual inductance coupling may exist between the inductors of the different resonators. It is known that coupling will change the effective inductance of the inductors but will not effect the noise performance provided the noise is only created in the resonators. If there is a considerable noise contribution from the amplifier as well, the Q-value of the feedback loop should be as large as possible by making a large capacitance value for parallel resonance or a large inductor value for series resonance. For parallel resonance, positive coupling, which increases the effective inductance, is undesired. For series resonance, coupling will increase the performance but mutual coupling always gives an offset in the resonance frequency which can be compensated for with the capacitor. Therefore, the capacitance and inductance values are chosen based on these considerations.

The embodiments of the present invention are directed to cascading units which include a passive frequency selective circuit and an active amplifier being a unidirectional or unilateral device which acts as a buffer. As a result, interaction and loading is prevented between the passive frequency selective circuits and the effective Q-value is increased so that a net gain in the stability of the oscillator is realized.

The invention being thus described, it would be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An oscillator having increased stability comprising:

a plurality of units cascaded in a loop having an output, an oscillator output signal being provided at the output, each of said cascaded units including, a passive frequency-selective circuit tuned to a maximum phase derivative, and an active amplifier;

said plurality of units being cascaded to form said loop for feeding back said oscillator output signal to said active amplifiers through said passive frequency-selective circuits.

2. An oscillator according to claim 1, wherein each of said passive frequency-selective circuits comprises a resonator.

3. An oscillator according to claim 1, wherein each of said active amplifiers is a unilateral or unidirectional device which acts as a buffer to prevent interaction between said passive frequency-selective circuits.

4. An oscillator according to claim 1, wherein each of said frequency-selective circuits is a unilateral four-port device.

5. An oscillator according to claim 1, wherein the oscillator is a voltage or current controlled oscillator.

6. An oscillator according to claim 2, wherein at least one of said resonators comprise a controller component.

7. An oscillator according to claim 2, wherein at least one of said resonators comprise a varactor in parallel to a resonance capacitor.

8. An oscillator according to claim 1, wherein the oscillator generates a total phase rotation of 360°×n, where n is an integer or zero.

9. A method for providing an oscillator having increased stability, comprising the steps of:

forming an oscillating loop having an output from a plurality of cascaded units, each of said cascaded units including a passive frequency-selective circuit tuned to a maximum phase derivative and an active amplifier;

providing an oscillator output signal at said output of said oscillating loop; and feeding back said oscillator output signal to said active amplifiers through said passive frequency-selective circuits by said plurality of cascaded units of said oscillating loop.

10. A method according to claim 9, wherein said passive frequency-selective circuits comprise resonators.

11. A method according to claim 9, wherein said active amplifiers are unilateral or unidirectional devices which act as buffers to prevent interaction between said passive frequency-selective circuits.

12. A method according to claim 9, wherein said frequency-selective circuits are unilateral four-port devices.

13. A method according to claim 9, wherein the oscillator is a voltage or current controlled oscillator.

14. A method according to claim 10, wherein at least one of said resonators comprise a controller component.

15. A method according to claim 10, wherein at least one of said resonators comprise a varactor in parallel to a resonance capacitor.

16. A method according to claim 9, wherein the oscillator generates a total phase rotation of 360°×n, where n is an integer or zero.

* * * * *